United States Patent
Kadomura et al.

(10) Patent No.: US 6,352,937 B1
(45) Date of Patent: Mar. 5, 2002

(54) METHOD FOR STRIPPING ORGANIC BASED FILM

(75) Inventors: Shingo Kadomura, Kanagawa (JP); Jerry Wong, Fremont; Masato Toshima, Sunnyvale, both of CA (US)

(73) Assignees: Sony Corporation, Tokyo (JP); Gamma Precision Technology Inc., Santa Clara, CA (US)

( * ) Notice: Subject to any disclaimer, the term of this patent is extended or adjusted under 35 U.S.C. 154(b) by 0 days.

(21) Appl. No.: 09/067,377

(22) Filed: Apr. 27, 1998

(51) Int. Cl.[7] .............................................. H01L 21/00
(52) U.S. Cl. ........................ 438/725; 216/67; 438/737
(58) Field of Search ...................... 216/2, 67; 438/725, 438/737, 738; 134/1.1, 1.2, 1.3, 31

(56) References Cited

U.S. PATENT DOCUMENTS

| | | | | |
|---|---|---|---|---|
| 4,470,871 A | * | 9/1984 | White et al. ................. | 156/628 |
| 5,262,279 A | * | 11/1993 | Tsang et al. ................. | 430/311 |
| 5,669,979 A | * | 9/1997 | Elliot et al. ................. | 134/1 |
| 5,824,604 A | * | 10/1998 | Bar-Gadda ................... | 438/725 |
| 6,080,529 A | * | 6/2000 | Ye et al. ..................... | 430/318 |

OTHER PUBLICATIONS

Muraka, Shyam P., "Low dielectric constant materials for interlayer dielectric applications," Solid State Technology vol. 39, No. 3, pp. 83–90, Mar. 1996.*

* cited by examiner

*Primary Examiner*—William A. Powell
(74) *Attorney, Agent, or Firm*—Frommer Lawrence & Haug LLP; William S. Frommer; Mark W. Russell

(57) ABSTRACT

There is provided a method used for processing an organic low dielectric constant insulating film to a desired shape for enabling facilitated stripping of an organic film formed on top of the organic low dielectric constant insulating film. Specifically, there is provided a method for stripping an organic film formed on a layered unit having at least an organic low dielectric constant insulating film. This method includes generating radicals in a gas mainly composed of fluorine-based gas, and stripping the organic film by the generated radicals.

18 Claims, 1 Drawing Sheet

METHOD FOR STRIPPING ORGANIC BASED FILM

BACKGROUND OF THE INVENTION

1. Field of the Invention

This invention relates to an organic-based film, such as a resist film, formed on a layered unit having an organic-based low dielectric constant film exhibiting high reactivity to an oxygen plasma.

2. Related Art

An ultra-LSI device is demanded for integrating millions or more of devices on a chip each side of which measures only several mm. Since it is difficult to manufacture such highly integrated ultra LSI devices by simply miniaturizing the planar devices, a multi-layer interconnection structure of stacking the devices in plural layers is used. This multi-layer interconnection structure is indispensable in manufacturing a highly integrated ultra LSI.

The ultra LSI is also demanded for a high device function and a higher operating speed, and hence the prompt development of semiconductor forming process technique satisfying this demand is mandatory. The above-mentioned multi-layer interconnection technique may be mentioned as one of the types of the semiconductor forming process techniques.

However, with a device having the multi-layer interconnection structure, the inter-layer capacitance in the multi-layer interconnection structure is increased, as a result of which the signal delay time is also increased. Therefore, in keeping with the above-mentioned multi-layer interconnection technique, it is necessary to decrease the interlayer capacitance for shortening the signal delay time.

For meeting this demand, attention is directed to the low dielectric constant insulating film, as an inter-layer insulating film, and various investigations are being conducted on it. This low dielectric constant insulating film is classified into a film formed of an inorganic based film and an organic based film.

As the inorganic based films, a SiOF film is used in view of ease in film forming by plasma CVD. However, this SiOF film, low in dielectric constant among inorganic based materials, has a dielectric constant $\in$ of the order of 3.5, such that it cannot sufficiently reduce the above-mentioned inter-layer capacitance. Therefore, the inorganic-based low dielectric constant insulating film is thought to be insufficient for use as an inter-layer film in the ultra-LSI device.

On the other hand, there are many organic materials having a lower dielectric constant of 2 to 2.5 so that the above-mentioned inter-layer capacitance can be reduced sufficiently. Therefore, the low dielectric constant insulating film employing the organic materials is thought to be promising as the ultra-LSI.

Meanwhile, the low dielectric constant insulating film formed of the organic material is used in such a configuration that $SiO_2$ layers as protective layers are formed as upper and lower layers. These protective layers reduce the effect of the organic low dielectric constant insulating film on the interconnection layer.

In forming the organic low dielectric constant insulating film, usually the $SiO_2$ films of the upper and lower layers are formed by CVD and the organic low dielectric constant insulating film is formed by rotating coating.

The organic low dielectric constant insulating film is processed for forming connection holes or grooves reaching the interconnection layer. For this processing, techniques such as usual photolithographic techniques are used, and a resist mask formed of an organic material is formed on top of the organic low dielectric constant insulating film. Then, after desired processing, the resist mask is stripped. This stripping of the resist mask is usually by ashing by oxygen plasma. That is, with the conventional technique, the resist mask is stripped from the organic low dielectric constant insulating film by ashing with an oxygen plasma.

This ashing method is a technique for completely stripping the resist mask formed of an organic material. However, since the organic low dielectric constant insulating film is formed of an organic material similar to the resist mask material, it is a frequent occurrence that the organic low dielectric constant insulating film is ashed together with the resist mask.

The organic low dielectric constant insulating film then ceases to function as the inter-layer film having desired characteristics. That is, this technique experiences a problem that a device having an organic low dielectric constant insulating film cannot be processed to a desired shape.

SUMMARY OF THE INVENTION

It is an object of the present invention to provide a method for stripping an organic film which is applied for processing the organic low dielectric constant insulating film to a desired shape and which can easily strip the organic film formed on top of the organic low dielectric constant insulating film.

In one aspect, the present invention provides a method for stripping an organic film formed on a layered unit having at least an organic low dielectric constant insulating film including generating radicals in a gas mainly composed of fluorine-based gas and stripping the organic film by said radicals.

With the present method for stripping the organic film according to the present invention, the organic film is stripped by radicals generated in the gas mainly composed of a fluorine-based gas. These radicals are lower in reactivity with the organic low dielectric constant insulating film than with the organic film and hence are not reacted with the organic low dielectric constant insulating film. Thus, with the present technique, the organic film can be stripped from the organic low dielectric constant insulating film without the risk of ashing thereof.

In stripping the organic film according to the present invention, it is also possible to add oxygen to the gas mainly composed of the fluorine-based gas.

By adding oxygen, the radical generating reaction for the fluorine-based gas is accelerated to permit radicals to react efficiently with the organic film.

In another aspect, the present invention provides a method for stripping an organic film formed on a layered unit having at least an organic low dielectric constant insulating film including generating radicals in a gas mainly composed of ammonia and stripping the organic film by these radicals.

In the method for stripping the organic film according to the present invention, an inert gas can also be added to the above-mentioned gas composed mainly of ammonia.

In this case, by adding the inert gas, it is possible to control ammonia to desired concentration and hence to control the amount of yielded radicals. Thus, with this technique, the organic film can be stripped with a controlled stripping rate.

In yet another aspect, the present invention provides a method for stripping an organic film formed on a layered unit having at least an organic low dielectric constant insulating film, including stripping part of the organic film formed on a layered unit at least having an organic low dielectric constant insulating film, and subsequently stripping the remaining portion of the organic film by radicals generated in a gas mainly composed of ammonia.

In this stripping method for the organic film according to the present invention, part of the organic film is first stripped by radicals generated in the gas mainly composed of the fluorine gas, and the remaining portion of the organic film is stripped by radicals generated in the gas mainly composed of ammonia. That is, with the technique, the organic low dielectric constant insulating film is ashed in two separate steps. First, the organic film is ashed by radicals generated in the gas mainly composed of the fluorine-based gas. Subsequently, the remaining portion of the organic film is completely stripped by radicals generated in the gas mainly composed of ammonia. This technique permits complete stripping of the organic film formed on the layered unit.

With the method for stripping the organic film according to the present invention, the organic film can be positively removed without the risk of stripping the organic low dielectric constant insulating film, because of the low reactivity between radicals removing the organic film and the organic low dielectric constant insulating film. Thus, with this technique, a semiconductor device having a desired shape can be manufactured without incurring the risk of etching the organic low dielectric constant insulating film.

EMBODIMENTS OF THE INVENTION

Figure 1:
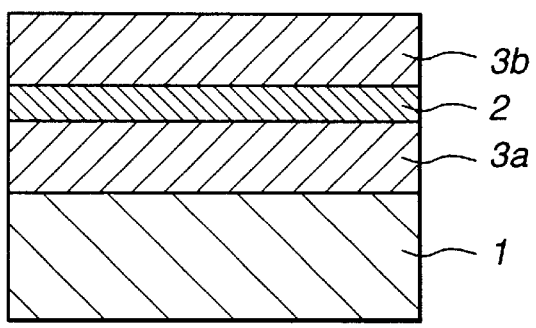
FIG. 1 is a cross-sectional view showing essential portions of a layered unit having an organic low dielectric constant insulating film.

Referring to the drawings, preferred embodiments of the method for stripping an organic film according to the present invention will be explained in detail.

The method for stripping the organic film according to the present invention is used for stripping an organic film formed on a layered unit having an organic low dielectric constant insulating film. In the present invention, the layered unit having the organic low dielectric constant insulating film includes a pair of organic low dielectric constant insulating films $3a$, $3b$ formed on a lower interconnection film 1 for sandwiching a $Sl_3N_4$ film 2 in-between.

With the layered unit constructed as described above, an organic film 4 is formed to a pre-set shape on the upper organic low dielectric constant insulating film $3b$, and a connection hole 5 is formed using this organic film 4 as a resist mask. This connection hole 5 is formed by boring in the layered unit exposed from the organic film 4 to a depth sufficient to expose the lower interconnection film 1 to outside.

The organic low dielectric constant insulating films $3a$, $3b$ are insulating films formed of an organic material of a relatively low dielectric constant. The organic low dielectric constant insulating films $3a$, $3b$ are preferably of a dielectric constant $\in$ not larger than 3.0. Thus, with the organic low dielectric constant insulating films $3a$, $3b$, having the dielectric constant $\in$ not larger than 3.0, it is possible to reduce the inter-layer capacitance significantly in an ultra-LSI having a high transistor integration degree due to the use of the multi-layer interconnection technique.

Examples of the organic low dielectric constant insulating films $3a$, $3b$ include fluorocarbon based materials, such as cyclo perfluorocarbon polymer (manufactured by ASAHI GLASS) or si-top mixed resin (manufactured by ASAHI GLASS), fluoine-containing polyimide-based materials, such as polyimide, fluorized polyallyl ether based materials, such as polyallyl ether, fluorine-containing valerin-based materials, and tetrafluoroethylene based materials. In the present invention, the organic low dielectric constant insulating films $3a$, $3b$ are not limited to the above-mentioned illustrative materials, but may be any suitable insulating films of an organic material of a relatively low dielectric constant that can be used as an interlayer film.

Figure 2:
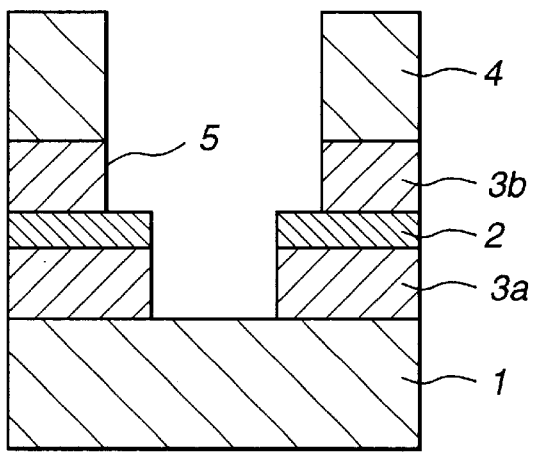
FIG. 2 is a cross-sectional view showing essential portions of an organic low dielectric constant insulating film formed with an organic film and with a connection hole.
Figure 3:
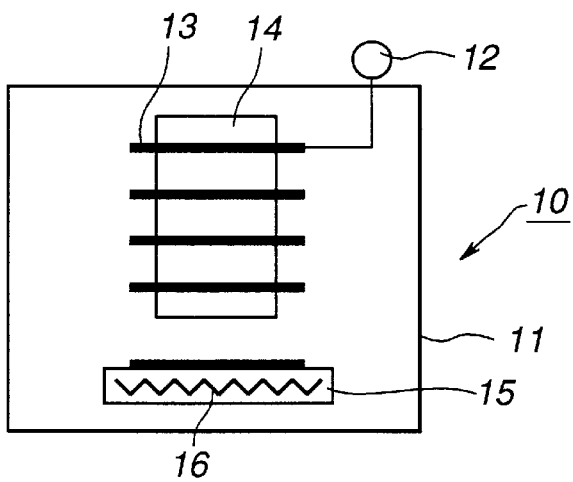
FIG. 3 is a schematic view of a ICP plasma generating device.

The organic film 4 is formed mainly of an organic material and contains an additive such as a photosensitive material. In the present embodiment, the organic film 4 is formed of an organic material generally used as a resist mask or as an anti-reflective film. The organic film 4 can be formed by two or more layers, instead of by a sole layer, as shown in FIG. 2.

Specifically, the resist mask may be roughly classified into a negative type photoresist, a positive type photoresist, a silylated resist, rubber-like resist and azide-based resist. In the present invention, the organic film 4 is not limited to the above-mentioned illustrative materials, but may be any suitable organic materials that can be used for resist masks. With this technique, the organic film 4, formed as a resist mask on the organic low dielectric constant insulating film $3b$, is stripped. In the present embodiment, the organic film 4 is stripped by radicals generated in a gas mainly composed of a fluorine-based gas, and subsequently the organic film 4 is stripped by radicals generated in a gas mainly composed of ammonia.

At this time, the organic film 4 is stripped from the organic low dielectric constant insulating film $3b$ on etching by a high-frequency inductively-coupled plasma generating device 10, abbreviated herein to ICP generating device.

This ICP plasma generating device 10 includes a stripping vessel 11, charged with a pre-set gas, a power source 12, an RF antenna 13 arranged in the stripping vessel 11 and connected to the power source 12, a quartz discharge tube 14 adapted for generating a plasma by a high frequency voltage supplied to the quartz discharge tube 14, a wafer stage 15 arranged facing the quartz discharge tube 14, and a temperature controller 16 adapted for temperature-controlling the wafer stage 15. With the ICP plasma generating device 10, a layered unit having the organic film 4 is set on the wafer stage 15.

With the present technique, the stripping vessel 11 is first charged with a gas mainly composed of a fluorine-based gas. With the ICP plasma generating device 10, the high-frequency voltage is supplied from the power source 12 to the RF antenna 13 so that a plasma is generated from the quartz discharge tube 14. Thus, in the present ICP plasma generating device 10, the fluorine-based gas charged in the stripping vessel 11 undergoes a radical-generating reaction to generate radicals.

Specifically, the fluorine gas, undergoing the radical-generating reaction, is decomposed into F radicals and $CF_3$ radicals. That is, these F and $CF_3$ radicals exist in the stripping vessel 11.

With the ICP plasma generating device 10, the organic film 4 set on the wafer stage 15 is stripped by these radicals. Specifically, the organic film 4 is etched with the F and $CF_3$ radicals operating as reaction species. This etches the organic film 4 to strip it from the organic low dielectric constant insulating film 3b.

At this time, the organic low dielectric constant insulating films 3a, 3b tend to be exposed to the inner rim surface of the connection hole 5 and hence are exposed to the radicals. Also, with progress of the stripping of the organic film 4, the organic low dielectric constant insulating film 3b, the organic low dielectric constant insulating film 3b starts to be exposed to outside and hence to radicals.

However, since the F and $CF_3$ radicals are lower in reactivity with respect to the organic low dielectric constant insulating films 3a, 3b than with respect to the organic film 4 and hence do not strip the organic low dielectric constant insulating films 3a, 3b. It is because the organic film 4 if used as a resist mask contains additives such as photosensitive agent and hence undergoes photochemical reaction so that it is lower in the force of interatomic bondage than the organic low dielectric constant insulating films 3a, 3b used as inter-layer film. Stated differently, the organic low dielectric constant insulating films 3a, 3b are relatively strong in interatomic bondage and hence are not etched by the energies of the F and $CF_3$ radicals. Thus, with the present technique, only the organic film 4 can be stripped selectively.

It is also possible with this technique to add a pre-set amount of oxygen into the stripping vessel 11 to permit the stripping of the organic film 4 to proceed efficiently. At this time, oxygen promotes the radical-generating reaction of the fluorine-based gas. By generating radicals using the oxygen-containing fluorine-based gas, it is possible to generate radicals efficiently to strip the organic film 4 efficiently.

It is noted that the amount of addition of oxygen is preferably on the order of 5 to 75 sccm for the flow rate of the fluorine-based gas of 100 sccm. If the amount of addition of oxygen is less than 5 sccm for the flow rate of the fluorine-based gas of 100 sccm, it may be an occurrence that the effect of accelerating the radical generating reaction based on the fluorine gas can hardly be expected. If the amount of addition of oxygen is larger than 75 sccm for the flow of the fluorine-based gas of 100 sccm, it is feared that the organic low dielectric constant insulating films 3a, 3b may tend to be incinerated by the oxygen radicals along with the organic film 4.

In the present embodiment, a mixture of cyclo fluorocarbon polymer and a siloxane copolymer ('Si-Top', trade name of a product of ASAHI KASEI) is used as the material for the organic low dielectric constant insulating films 3a, 3b, while $C_2F_6$ is used as a fluorine-based gas. Also, in the present embodiment, oxygen is added so that the ratio of the flow rate of $C_2F_6$/flow rate of $O_2$=350 sccm/1200 sccm. In the ICP plasma generating device 10, the pressure in the stripping vessel 11 is set to 0.8 Torr, while the power supplied from the power source 2 is set to 400 W. The temperature in the wafer stage 15 is adjusted to 25° by the temperature controller 16.

The temperature of the wafer stage 15 is preferably controlled to be not higher than approximately 100° C. so that, on addition of an oxygen gas, the organic low dielectric constant insulating films 3a, 3b will not be subjected to unexpected incineration by oxygen radicals. If the temperature of the wafer stage 15 is higher than approximately 100° C., the organic low dielectric constant insulating films 3a, 3b tend to be incinerated by oxygen radicals yielded in a minor quantity in the stripping vessel 11.

In the present technique, as described above, the organic film 4 is stripped by radicals generated in the gas mainly composed of fluorine gas. This substantially strips the organic low dielectric constant insulating films 3a, 3b from the organic film 4.

Then, in the present embodiment, the organic film 4 is stripped by radicals generated in the gas composed mainly of ammonia. This is a step of completely stripping the organic film 4 left in a minor quantity on the organic low dielectric constant insulating films 3a, 3b.

At this time, the stripping vessel 11 of the ICP plasma generating device 10 is charged with a gas mainly composed of ammonia. Similarly to the gas mainly composed of the fluorine-based gas, the gas mainly composed of ammonia undergoes a radical generating reaction to yield N or H radicals in the stripping vessel 11.

With this technique, it is possible to strip completely the organic film 4 left in a trace quantity on the organic low dielectric constant insulating films 3a, 3b by these N or H radicals. Since the organic film 4 is removed by the N or H radicals lower in reactivity than F or $CF_3$ radicals, it is possible to prevent reliably the organic low dielectric constant insulating films 3a, 3b from undergoing the etching reaction.

During this process, a pre-set amount of the inert gases are preferably added into a gas mainly composed of ammonia. The inert gases may be enumerated by $N_2$ gas, and rare gases, such as Ar, He, kr or Xe gases. At this time, addition of the inert gases leads to dilution of ammonia. This controls the yielded amounts of N and H radicals to control the rate of stripping of the organic film 4.

In this case, the amount of addition of the inert gas is preferably not larger than 300 sccm for the ammonia flow rate of 100 sccm. If the amount of addition of the inert gas is larger than 300 sccm for that of ammonia of 100 sccm, the concentration of ammonia in the stripping vessel 11 tends to be too low to effect the desired stripping. On the other hand, if no inert gas is added, the effect of controlling the radical generating reaction based on ammonia tends to be decreased.

In the present embodiment, an Ar gas is used as the inert gas, and is added in an amount which will give the ratio of the flow rate of ammonia/flow rate of Ar gas=500 sccm/800 sccm. In the ICP plasma generating device 10, the pressure in the stripping vessel 11 is set to 0.5 Torr, while the power furnished form the power source 12 is set to 700 W and the temperature of the wafer stage 15 is adjusted to 160° C. by the temperature controller 16.

If the inert gas is added in this manner, the temperature of the wafer stage 15 is preferably controlled to be not lower than 150° C. by the temperature controller 16 in view of the low reactivity of the N or H radicals with respect to the organic film 4. If the temperature of the wafer stage 15 is lower than 150° C., there is a risk that the organic film 4 cannot be stripped satisfactorily.

Thus, with the present embodiment, the organic film 4 formed on the organic low dielectric constant insulating films 3a, 3b can be stripped substantially completely. In particular, with the present technique, the organic film 4 is stripped substantially in its entirety using C and F radicals, lower in reactivity than the oxygen plasma used in the conventional ashing method, and the organic film 4 then is stripped completely using N and H radicals lower in alkalinity than C and F radicals. Thus, with the present technique, the organic film 4 formed on the organic low dielectric constant insulating films 3a, 3b can be stripped completely without substantially etching the organic low dielectric constant insulating films 3a, 3b. Thus, with the present technique, there is no risk of affecting the shape of the organic low dielectric constant insulating films 3a, 3b.

Figure 4:
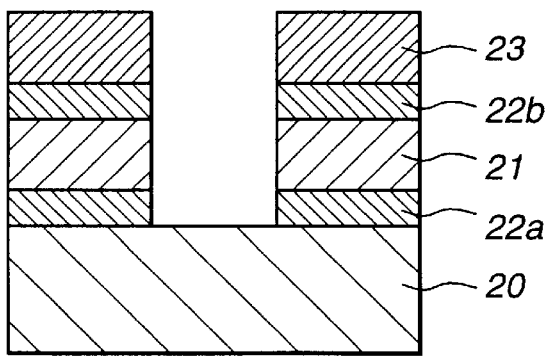
FIG. 4 is a cross-sectional view showing essential portions of the layered unit having an organic low dielectric constant insulating film.

In an alternative embodiment of the present invention, a layered unit having an organic low dielectric constant insulating film is formed on an underlying layer 20 and is comprised of an organic low dielectric constant insulating film 21 sandwiched between a pair of protective films 22a, 22b, as shown in FIG. 4. In the present embodiment, an organic film 23 is a resist mask used for boring a via-hole 24 in the layered unit for exposing the underlying layer 20, and is formed of the same material as the above-mentioned organic film 4. In the present embodiment, the organic low dielectric constant insulating film 21 used is formed of polyallyl ether manufactured by ALLIED SIGNAL INC. under the trade name of Flare film.

The paired protective films 22a, 22b are each formed by a $SiO_2$ film. The material of these aired protective films 22a, 22b is not limited to $SiO_2$ but may also be phosphor-silicate glass (PSG), boron phosphor silicate glass (BPSG) or spin-on glass (SOG). The paired protective layers maybe of inorganic materials other than those given above if the materials used are low in dielectric constant and exhibit characteristics desired of the inter-layer insulating films, such as insulating properties.

In the present embodiment, as in the above case, the organic film 23 is stripped beginning from an upper part of the organic low dielectric constant insulating film 21, by stripping the organic film 23 by radicals yielded in gas mainly composed of the fluorine-based gas and then removing the organic film 23 by radicals yielded in the gas mainly composed of ammonia.

When removing the organic film 23 in this manner, the above-mentioned ICP plasma generating device 10 as described above is used. For stripping the organic film 23 using radicals in the gas mainly composed of the fluorine based gas, $C_2F_6$ is used as a fluorine-based gas, and oxygen is added so that the flow rate of $C_2F_6$/flow rate of $O_2$=500 sccm/1200 sccm. The ICP plasma generating device 10 at this time was set so that the pressure in the stripping vessel 11 is 0.8 Torr, the power supplied by the power source 12 is 400 W and the temperature of the wafer stage 15 is 25° C.

For stripping the organic film 23 using radicals in the gas mainly composed of ammonia, the ICP plasma generating device 10 was set so that the pressure in the stripping vessel 11 is 0.5 Torr, the power supplied by the power source 12 is 700 W and the temperature of the wafer stage 15 is 160° C.

With the present embodiment, as described above, the organic film 23 is formed on the layered unit comprised of the organic low dielectric constant insulating film 21 sandwiched between the paired protective layers 22a, 22b, as shown in FIG. 4. It is this organic film 23 that is to be stripped. With the present technique, the organic film 23 formed on the organic low dielectric constant insulating film 21 can be stripped completely. In particular, with the present technique, the organic film 23 is stripped substantially in its entirety using C and F radicals, lower in reactivity than the oxygen plasma used in the conventional ashing method, and the organic film 23 then is stripped completely using N and H radicals lower in alkalinity than C or F radicals. Thus, with the present technique, the organic film 23 formed on the organic low dielectric constant insulating film 21 can be removed completely without substantially etching the organic low dielectric constant insulating film 21. Thus, with the present technique, there is no risk of affecting the shape of the organic low dielectric constant insulating film 21.

In this case, there is the risk of the $SiO_2$ film, as the protective films 22a, 22b, becoming etched by radicals. This etching of the protective films 22a, 22b can, however, be supposed by suppressing the temperature of the wafer stage 15 to a lower temperature.

The present invention is not limited to the above-described merely illustrative embodiments. That is, the method of the present invention for stripping the organic film may also be used for stripping an organic film by radicals generated in a gas mainly composed of fluorine based gases.

Stated differently, the present technique strips the organic film solely by radicals generated in the gas mainly composed of the fluorine-based gas, there being no step in the present technique of stripping the organic film by radicals generated in the gas mainly composed of ammonia. With the present technique, the organic film is readily etched by radicals and stripped from the organic low dielectric constant insulating film.

With the present technique, it is also possible to strip the organic film efficiently by adding oxygen to the gas mainly composed of the fluorine based gas. Also, with the present technique, ashing of the organic low dielectric constant insulating film by radicals can be prevented reliably by adjusting the layered unit including the organic low dielectric constant insulating film to a relatively low temperature.

The method for stripping he organic film according to the present invention may also be configured for stripping the organic film using radicals generated in the gas mainly composed of ammonia. Stated differently, the present technique strips the organic film solely by radicals generated in the gas mainly composed of the ammonia-based gas, there being no step in the present technique of stripping the organic film by radicals generated in the gas mainly composed of the fluorine based gas. With the present technique, the organic film is readily etched by radicals and stripped from the organic low dielectric constant insulating film.

With the present technique, since the radicals generated in the gas mainly composed of ammonia is lower, there is no risk of etching the organic low dielectric constant insulating film. Also, by setting the temperature of the layered unit having the organic low dielectric constant insulating film to a higher value, it becomes possible to accelerate the etching of the organic film.

What is claimed is:

1. A method for stripping an organic film formed on a layered unit having at least an organic low dielectric constant insulating film, comprising:
    generating radicals in a gas mainly composed of fluorine-based gas; and
    stripping the organic film by said radicals.

2. The method as claimed in claim 1 wherein oxygen is added to a gas mainly composed of said fluorine-based gas.

3. The method as claimed in claim 1 wherein the organic low dielectric constant insulating film has a dielectric constant not higher than 3.0.

4. The method as claimed in claim 1 wherein the fluorine-based gas is a fluorocarbon gas.

5. A method for stripping an organic film formed on a layered unit having at least an organic low dielectric constant insulating film, comprising:

generating radicals in a gas mainly composed of ammonia; and stripping the organic film by said radicals.

6. The method as claimed in claim 5 wherein an inert gas is added to the gas mainly composed of ammonia.

7. The method as claimed in claim 5 wherein the organic low dielectric constant insulating film has a dielectric constant not higher than 3.

8. A method for stripping an organic film formed on a layered unit having at least an organic low dielectric constant insulating film, comprising:

stripping part of said organic film by radicals generated in a gas mainly composed of a fluorine-based gas; and subsequently stripping the remaining portion of the organic film by radicals generated in a gas mainly composed of ammonia.

9. The method as claimed in claim 8 wherein oxygen is added to the gas mainly composed of the fluorine-based gas.

10. The method as claimed in claim 8 wherein the organic low dielectric constant insulating film has a dielectric constant not higher than 3.0.

11. The method as claimed in claim 8 wherein the fluorine-based gas is a fluorocarbon gas.

12. The method as claimed in claim 8 wherein an inert gas is added to the gas mainly composed of ammonia.

13. A method for selectively stripping an organic film formed on a layered unit wherein at least one of the layers on said unit is an organic low dielectric constant insulating film, which exhibits a high reactivity to an oxygen plasma, comprising:

generating radicals in a gas consisting of mainly a fluorine-based gas and, optionally, oxygen or consisting of mainly ammonia and, optionally, an inert gas or mixtures of inert gases; and selectively stripping the organic film completely from the unit without stripping the organic low dielectric constant insulating film by the contacting the unit coated with the organic film with said radicals.

14. The method according to claim 1, where the layered unit is heated to a temperature of not more than about 100° C.

15. The method according to claim 1, where the gas consists of mainly a fluorine-based gas and, optionally, oxygen.

16. The method according to claim 5, where the layered unit is heated to a temperature is between 150° C. to 160° C.

17. The method according to claim 5, where the gas consists of ammonia and, optionally, an inert gas.

18. A method for selectively stripping an organic film formed on a layered unit wherein at least one of the layers on said unit is an organic low dielectric constant insulating film which exhibits reactivity to an oxygen plasma, comprising:

generating radicals in a gas mainly composed of either:
a) a fluorine-based gas; or
b) ammonia; and selectively stripping the organic film completely from the unit without stripping the organic low dielectric constant insulating film by contacting the unit coated with the organic film with said radicals.

* * * * *